(12) United States Patent
Garreau et al.

(10) Patent No.: US 7,466,142 B2
(45) Date of Patent: Dec. 16, 2008

(54) ANECHOIC CHAMBER FOR DIRECT OBSERVATION OF THE ELECTROMAGNETIC BEHAVIOR OF A TOOL

(75) Inventors: Philippe Garreau, Mennecy (FR); Luc Duchesne, Angervilliers (FR); Per Olav Iversen, Marietta, GA (US); Arnaud Gandois, Breux Jouy (FR)

(73) Assignee: Ste d'Applications Technologiques de l'Imagerie Micro Ondes (FR)

( * ) Notice: Subject to any disclaimer, the term of this patent is extended or adjusted under 35 U.S.C. 154(b) by 0 days.

(21) Appl. No.: 10/568,667

(22) PCT Filed: Aug. 18, 2004

(86) PCT No.: PCT/FR2004/002153

§ 371 (c)(1),
(2), (4) Date: Feb. 16, 2006

(87) PCT Pub. No.: WO2005/019844

PCT Pub. Date: Mar. 3, 2005

(65) Prior Publication Data

US 2006/0208746 A1    Sep. 21, 2006

(30) Foreign Application Priority Data

Aug. 18, 2003   (FR)   ..................................... 0309985

(51) Int. Cl.
*G01R 27/28* (2006.01)
*H01Q 17/00* (2006.01)

(52) U.S. Cl. .............................. 324/628; 324/627; 342/1

(58) Field of Classification Search ................. 324/627, 324/628; 342/1
See application file for complete search history.

(56) References Cited

U.S. PATENT DOCUMENTS

| 4,968,983 | A | * | 11/1990 | Maeda | ........................ 343/703 |
| 5,134,405 | A | * | 7/1992 | Ishihara et al. | .................. 342/1 |
| 5,514,833 | A | * | 5/1996 | Kuth | ........................... 353/74 |
| 6,329,953 | B1 | * | 12/2001 | McKivergan | ................ 343/703 |

FOREIGN PATENT DOCUMENTS

FR    2 797 327 A    2/2001

OTHER PUBLICATIONS

Fourestie et al, "A Novel Near-Field Measurement Facility for Random Emissions", 2001 International Symposium on Electromagnetic Compatibility; Montréal, Que., Canada, Aug. 13-17 2001, vol. 1, pp. 378-382.
Eo, et al., "A New Electromagnetic Interference (EMI) Noise Estimation Technique and Experimental Verification of a PDP System", Asia Display/IDW 2001; Nagoya, Japan, Oct. 16-19 2002, 2001, pp. 989-992.

* cited by examiner

*Primary Examiner*—Timothy J Dole
(74) *Attorney, Agent, or Firm*—Lerner, David, Littenberg, Krumholz & Mentlik, LLP

(57) ABSTRACT

An apparatus for studying the electromagnetic behavior of an electromagnetic wave-emitting or electromagnetic wave-receiving tool is provided. An anechoic chamber is configured to receive the tool as well as a person handling the tool. At least one analysis antenna is configured to pick-up the electromagnetic waves emitted from or received by the tool. Signals outputted by the analysis antenna are processed, and a radiation diagram associated with the electromagnetic tool is displayed. The radiation diagram is displayed inside the anechoic chamber so that the person handling the electromagnetic tool observes how the handling of the tool affects its electromagnetic behavior.

9 Claims, 2 Drawing Sheets

FIG_1

ANECHOIC CHAMBER FOR DIRECT OBSERVATION OF THE ELECTROMAGNETIC BEHAVIOR OF A TOOL

CROSS-REFERENCE TO RELATED APPLICATIONS

The present application is a national stage application under 35 U.S.C. § 371 of International Application No. PCT/FR2004/002153, filed Aug. 18, 2004, which claims priority from French Application No. 0309985, filed Aug. 18, 2003, the disclosures of which are incorporated by reference herein.

BACKGROUND OF THE INVENTION

The invention concerns devices for measuring the radiation from antennae, and in particular devices for evaluating the radiation diagram of an antenna.

We are already familiar with anechoic chambers, in the form of an enclosure capable of receiving not only the antenna to be examined, but also an operator who positions, or even holds the antenna during the tests.

Such anechoic chambers can contain a series of analysis antennae, positioned on a circle surrounding the antenna to be examined. The output signals from this series of test antennae provide the data used to draw a radiation diagram in the plane on which this circle is located at any given moment.

By effecting a relative rotation between the antenna to be examined and the analysis antennae, one can therefore produce a series of radiation diagrams, where all of these are used to create a picture of the overall radiation pattern in three dimensions diagrams.

We are also already familiar with such devices for measuring the radiation from the mobile telephones, in which the user of the telephone is himself placed inside the circle formed by the different analysis antennae.

Nowadays, the characterisation and/or the monitoring of an antenna or of any other electromagnetic object, whether transmitter or receiver, are currently outsourced to the possessor of an anechoic chamber equipped as described who, in return, provides the designer of the antenna with the requested radiation diagram.

The design of an antenna can involve multiple structural changes in the course of its design, according to the radiation that is measured around it in an anechoic test chamber.

It appears nowadays that people are requiring faster and faster feedback from these analysis. In particular in the context of an antenna design process, the analyses for successive different versions of the antenna have to be supplied with increasing rapidity.

SUMMARY OF THE INVENTION

The aim of the invention is to meet this demand by providing the antenna designer with a very fast analysis feedback system, enabling him to make changes to the antenna with great speed.

This aim is met by the invention by virtue of an arrangement for studying the electromagnetic behavior of a wave-emitting or wave-receiving tool. An anechoic chamber is configured to receive the electromagnetic tool as well as a person handling the tool. At least one analysis antenna is configured to pick up the radiation emitted from or received by the electromagnetic tool. Means for processing the output signals from the analysis antenna and means for displaying a radiation diagram created for the electromagnetic tool are also provided. The means for displaying the radiation diagram is disposed inside the anechoic chamber so that the person handling the electromagnetic tool is able to directly observe the effect of the person's handling the tool on the electromagnetic behavior of the tool. The tool can also be fitted directly onto the person handling the tool in the anechoic chamber (on viewing goggles, for example) or fitted onto another person located in the anechoic chamber.

Other characteristics, objectives and advantages of the invention will appear on reading the detailed description that follows, provided with reference to the appended figures.

DETAILED DESCRIPTION

Figure 1:
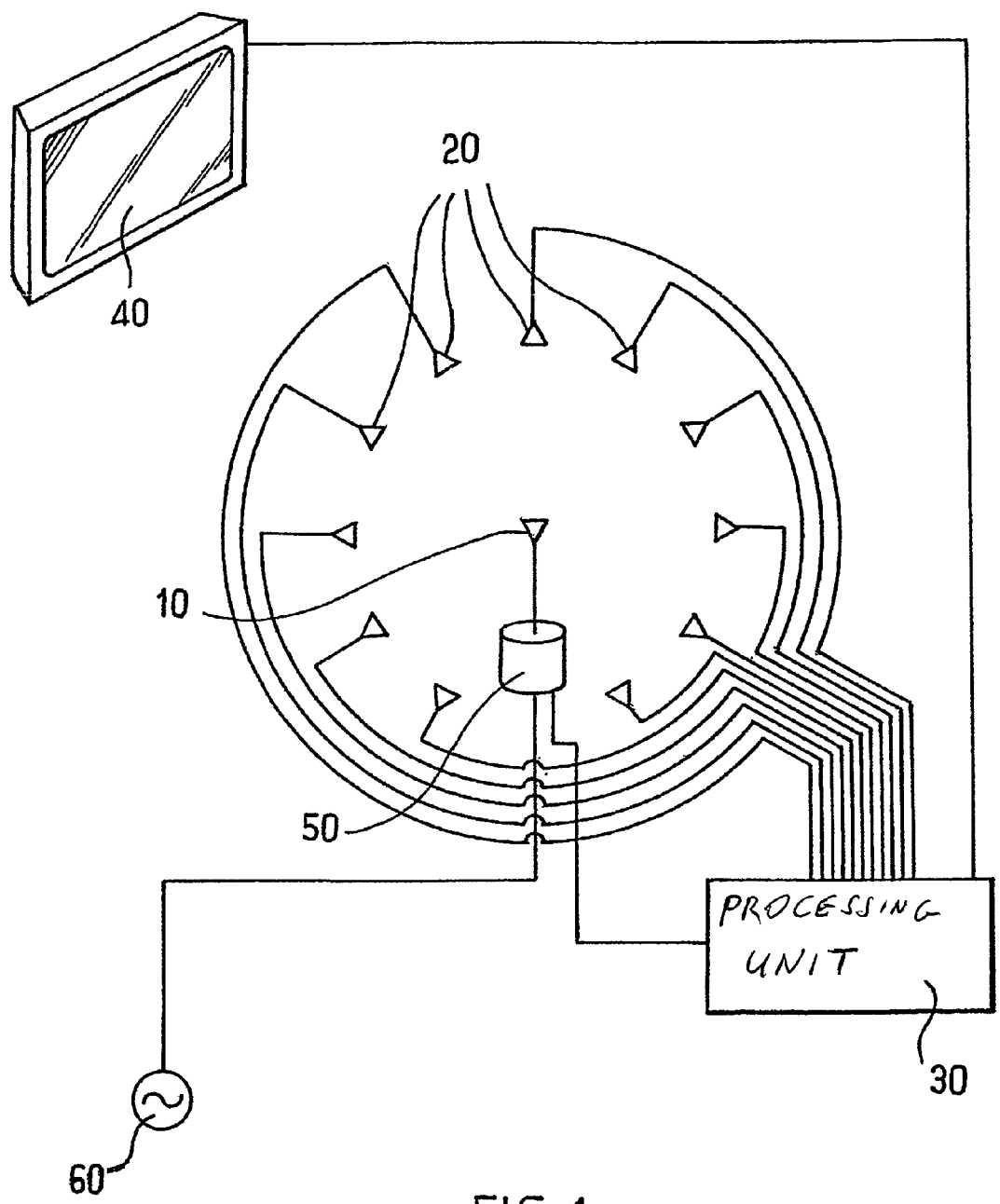
FIG. 1 is an electrical diagram of a study arrangement according to the invention.

As illustrated in the simplified diagram in FIG. 1, the analysis device has a simple functional structure, based on a series of devices, each of which is known in its own right.

Thus, the device is built around a series of analysis antennae or a network of analysis probes 20 distributed in a circle around an antenna to be studied 10.

The analysis antennae 20 are connected to a processing unit 30, whose role is to convert the signals supplied by the antennae 20 into a video display signal. This video signal is proportional to the field radiated by the antenna under test in the direction of the test antenna. This video signal is transmitted to a display screen 40, illustrated at the top of the figure.

We should also mention that the processing unit 30 is connected to a rotary motor 50 bearing the antenna to be studied 10, and receives from this motor 50 a positioning signal that is used to calculate the relative positions of the antenna to be studied 10 and the test antennae 20.

In the operating principle of the arrangement illustrated here, as the motor 50 rotates, the processing unit 30 acquires, in a known manner, a series of radiation readings in a series of successive planes, these planes being distributed in rotation around the antenna to be studied 10.

The assembly of these different plane readings allows the processing unit to provide a display in three dimensions of the radiation diagram of the antenna to be studied, and to show this display on the screen 40.

In FIG. 1, the walls of the chamber in which the antennae are located, are not shown. The walls shown in FIG. 2 form a closed space, and are each equipped, for example, with a multitude of pyramid-shaped pegs pointing inwards.

This arrangement eliminates the electromagnetic echo in the chamber, which is why it is called anechoic.

In FIG. 1, the walls of the chamber in which the antennae are located are not shown. The walls shown in FIG. 2 form a closed space, and are each equipped, for example, with a multitude of pyramid-shaped pegs pointing inwards.

According to one quite particular arrangement, the display screen 40, which until now has been placed outside the chamber, typically in an external space dedicated only to computer processing, is here brought into the chamber itself.

Positioned in the chamber, the screen 40 allows the operator to observe the behaviour of the antenna 10 which is directly within his reach, in real or slightly-deferred time.

The operator can then perform a role which he was denied hitherto, namely that of interpreting the behaviour of the antenna 10 (or of any other electromagnetic tool) while actually handling the latter. This arrangement allows the operator to change and act upon the antenna (or any other electromagnetic tool), and to view the resulting radiation diagram in an interactive manner.

Thus, changes aimed at improving the behaviour of the antenna are rendered possible in real time.

In this way, the operator 70 can simply alter the geometry of the antenna 10, or indeed its positioning in the chamber, such as its height, or its orientation, or the adjustment parameters, and can directly interpret the effects of his actions.

It turns out that this role assigned to the operator, namely interpreting the effects of his handlings, allows a far more effective exploration of the electromagnetic potential of the antennae and other electromagnetic tools.

Thus, developments which have gone unsuspected up to the present can be revealed very rapidly by experimental manipulation in the chamber.

A preferred variant consists, however, of placing this screen as far away as possible from the antenna, that is against a wall of the chamber.

Figure 2:
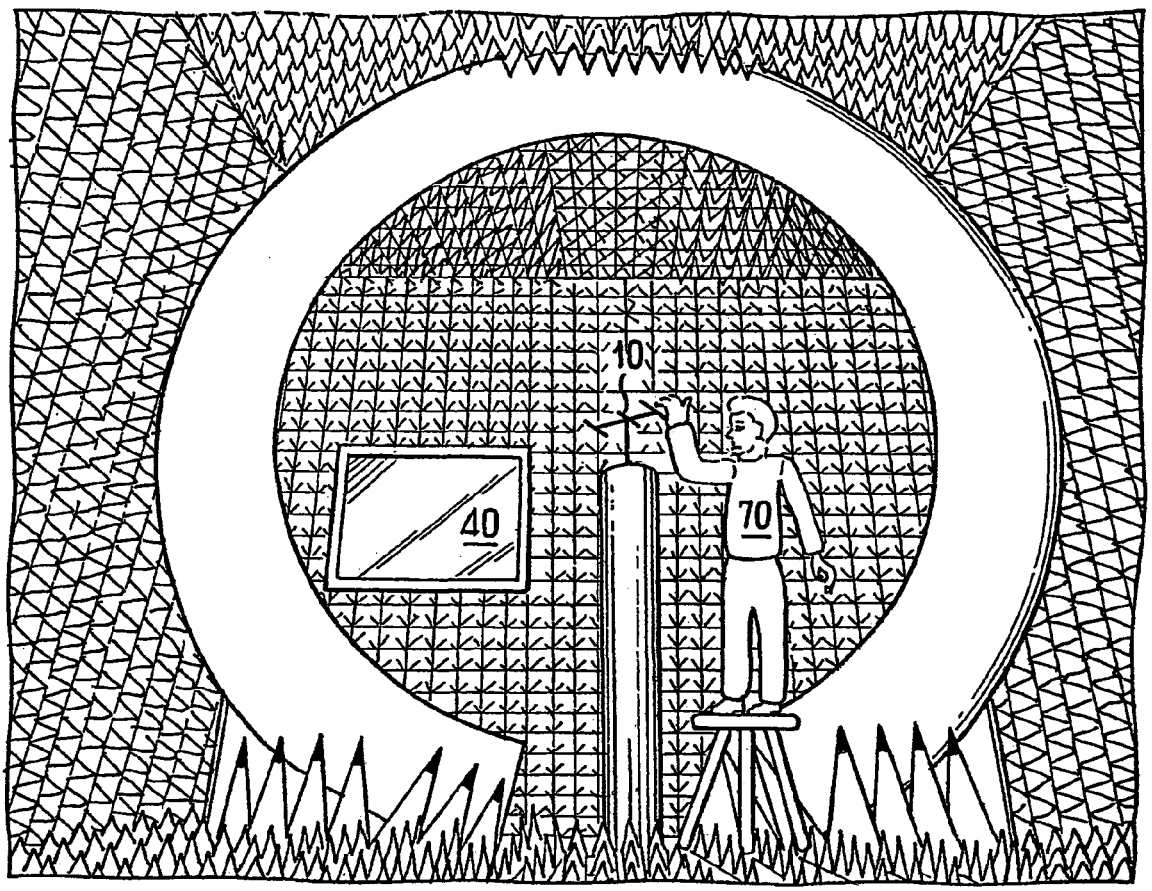
FIG. 2 is a general view of an anechoic chamber according to the invention.

In FIG. 2, the screen 40 is a flat liquid crystal or plasma screen, for example, whose positioning against a vertical wall of the chamber only slightly disrupts the electromagnetic radiation in the latter. The screen 40 can also be a conventional optical projection screen (computer+projector).

More generally, it is preferable to recess the viewing surface of the screen, for example the front surface of a flat or cathode-ray tube monitor, in the plane of the chamber wall, thus avoiding the introduction of any foreign volume into the chamber.

In a variant where the study consists of examining the behaviour of a mobile telephone or of any other portable electromagnetic appliance, and where it has been normal to place the user of the telephone within in the circle of the antennae, this present device also has an undoubted advantage in allowing account to be taken of the effect of the human body on the radiation pattern.

Thus, the user of the telephone, who until now has had an organic presence only, now has the advantage of direct and live observation of the effect of his presence.

Thus by varying the position of his body or of his telephone in relation to himself, the user is able to observe the effects of these variations live and direct.

It is thus rendered possible for the user to rapidly ascertain the various options for positioning the components of the telephone which may be particularly favourable to electromagnetic transmission in the presence of the human body.

Likewise, changes performed live on portable appliances reveal options for direct developments that have been quite unsuspected in the past.

According to an advantageous variant for such application to the mobile telephone, an arm rest is provided in order to help the operator to accurately position the arm bearing the mobile telephone, in addition to a seat placed at the centre of the test antennae and intended to accommodate the operator.

It proves to be highly advantageous to arrange for the telephone to be used with the elbow resting on a support, in order to prevent movements of the body from changing the conditions on which the measurements are based. This support has the benefit of enabling successive and repeatable measurements to be taken in the presence of operators.

In addition, such an armrest is preferably equipped with means for adjusting its position.

These position adjusting means can be designed for a height adjustment only or for height adjustment as well as horizontal movement in a forward and back or sideways motion in relation to the user.

According to the simplest variant, these adjustment means take the form of sliding guides which are secured after adjustment using a series of fixing screws.

The presence of such an armrest, or of a support for any other part of the arm, is also useful in that it allows the operator to leave his seat and then to resume his previous position in a comparatively accurate manner, namely to re-assume a relative position between body and telephone which is identical to that of the previous measurement, or nearly so.

Thus, if a change requires that the operator should leave his seat, the radiation emitted before and after this change remains reliable since it is measured under very similar conditions.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. An apparatus for studying the electromagnetic behavior of an electromagnetic wave-emitting or electromagnetic wave-receiving tool, said apparatus comprising:
    an anechoic chamber configured to receive the tool as well as a person handling the tool;
    at least one analysis antenna configured to pick-up the electromagnetic waves emitted from or received by the tool;
    means for processing signals outputted by said at least one analysis antenna to form a video display signal; and
    means for displaying a radiation diagram associated with the tool based on the video display signal, said means for displaying the radiation diagram including a display screen and being entirely disposed inside the anechoic chamber to enable the person handling the tool to observe how the handling of the tool affects its electromagnetic behavior.

2. An apparatus according to claim 1, wherein said at least one analysis antenna includes a plurality of analysis antennae that encircle the tool.

3. An apparatus according to claim 2, further comprising means for automatically producing a relative rotation between said plurality of analysis antennae and the tool about an axis of rotation that is substantially a diameter of a circle formed by said plurality of analysis antennae.

4. An apparatus according to claim 1, wherein said display screen is placed on an inside wall of said anechoic chamber.

5. An apparatus according to claim 1, wherein said means for displaying the radiation diagram of the tool includes viewing goggles wearable by the person handling the tool or by another person located in said anechoic chamber.

6. An apparatus according to claim 1, wherein said display screen includes a monitor screen or an optical projection screen and has a viewing surface substantially aligned with the plane of one of the walls of said anechoic chamber.

7. An apparatus according to claim 6, wherein said display screen is a liquid crystal display screen or a plasma monitor display screen.

8. An apparatus according to claim 1, wherein said display screen includes an optical projection screen.

9. An apparatus according to claim 1, further comprising a seat configured to accommodate the person handling the tool and a support for supporting an arm of the person, said seat being adjustable to allow positioning of the body of the person at a given body position and said support being adjustable to allow positioning of the arm at given arm position relative to the body position to allow successive use of a telephone held at the given arm position while substantially avoiding changes to the body position.

\* \* \* \* \*